United States Patent
Richards et al.

(10) Patent No.: US 11,830,578 B2
(45) Date of Patent: *Nov. 28, 2023

(54) MEMORY DEVICE CAPABLE OF ADJUSTING CLOCK SIGNAL BASED ON OPERATING SPEED AND PROPAGATION DELAY OF COMMAND/ADDRESS SIGNAL

(71) Applicant: Micron Technology, Inc., Boise, ID (US)

(72) Inventors: Randon K. Richards, Kuna, ID (US); Dirgha Khatri, Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/992,651

(22) Filed: Nov. 22, 2022

(65) Prior Publication Data

US 2023/0090116 A1 Mar. 23, 2023

Related U.S. Application Data

(63) Continuation of application No. 17/193,955, filed on Mar. 5, 2021, now Pat. No. 11,514,959, which is a continuation of application No. 16/518,767, filed on Jul. 22, 2019, now Pat. No. 10,943,628.

(51) Int. Cl.
*G11C 7/22* (2006.01)
*G11C 8/18* (2006.01)
*G06F 13/16* (2006.01)
*G11C 11/4076* (2006.01)
*G11C 11/4093* (2006.01)

(52) U.S. Cl.
CPC .......... *G11C 7/222* (2013.01); *G06F 13/1689* (2013.01); *G11C 8/18* (2013.01); *G11C 11/4076* (2013.01); *G11C 11/4093* (2013.01)

(58) Field of Classification Search
CPC ....... G11C 7/222; G11C 8/18; G11C 11/4076; G11C 11/4093; G06F 13/1689
See application file for complete search history.

(56) References Cited

U.S. PATENT DOCUMENTS

| | | | |
|---|---|---|---|
| 5,956,289 A | 9/1999 | Norman et al. | |
| 6,081,148 A | 6/2000 | Song | |
| 10,438,650 B1 | 10/2019 | Yamashita et al. | |
| 10,943,628 B2 | 3/2021 | Richards et al. | |
| 2009/0238025 A1* | 9/2009 | Shaeffer ............... | G11C 7/1072 365/194 |
| 2010/0220536 A1 | 9/2010 | Coteus et al. | |

(Continued)

*Primary Examiner* — Mushfique Siddique
(74) *Attorney, Agent, or Firm* — Holland & Hart LLP

(57) ABSTRACT

Methods, systems, and apparatuses for managing clock signals at a memory device are described. A memory device or other component of a memory module or electronic system may offset a received clock signal. For example, the memory device may receive a clock signal that has a nominal speed or frequency of operation for a system, and the memory device may adjust or offset the clock signal based on other operating factors, such as the speed or frequency of other signals, physical constraints, indications received from a host device, or the like. A clock offset value may be based on propagation of, for example, command/ address signaling. In some examples, a memory module may include a registering clock driver (RCD), hub, or local controller that may manage or coordinate clock offsets among or between various memory devices on the module. Clock offset values may be programmed to a mode register or registers.

20 Claims, 5 Drawing Sheets

(56) References Cited

U.S. PATENT DOCUMENTS

| | | |
|---|---|---|
| 2011/0158031 A1* | 6/2011 | Ware .......................... H03L 7/00 |
| | | 327/1 |
| 2012/0239870 A1 | 9/2012 | Tung et al. |
| 2012/0250433 A1* | 10/2012 | Jeon .................... G11C 11/4082 |
| | | 365/230.08 |
| 2012/0311371 A1 | 12/2012 | Shaeffer |
| 2015/0286408 A1* | 10/2015 | Hampel ................. G11C 21/00 |
| | | 711/154 |
| 2017/0017587 A1* | 1/2017 | West .................... G06F 13/4068 |
| 2019/0187744 A1 | 6/2019 | Chang et al. |
| 2020/0027494 A1 | 1/2020 | Yamashita et al. |
| 2020/0073562 A1 | 3/2020 | Kim |
| 2021/0027816 A1 | 1/2021 | Richards et al. |
| 2021/0193203 A1 | 6/2021 | Richards et al. |

* cited by examiner

MEMORY DEVICE CAPABLE OF ADJUSTING CLOCK SIGNAL BASED ON OPERATING SPEED AND PROPAGATION DELAY OF COMMAND/ADDRESS SIGNAL

CROSS-REFERENCE TO RELATED APPLICATIONS

This application is a continuation of U.S. patent application Ser. No. 17/193,955, filed Mar. 5, 2021; which is a continuation of U.S. patent application Ser. No. 16/518,767, filed Jul. 22, 2019, now U.S. Pat. No. 10,943,628; each of which is incorporated herein by reference in its entirety.

TECHNICAL FIELD

The present disclosure generally relates to semiconductor memory devices and, more particularly, to methods for clock signal alignment in a memory device and memory devices and systems employing the same.

BACKGROUND

Memory devices are widely used to store information related to various electronic devices such as computers, wireless communication devices, cameras, digital displays, and the like. Information is stored by programing different states of a memory cell. Various types of memory devices exist, including magnetic hard disks, random access memory (RAM), read only memory (ROM), static RAM (SRAM), dynamic RAM (DRAM), synchronous dynamic RAM (SDRAM), and others. Memory devices may be volatile or non-volatile. Improving memory devices, generally, may include increasing memory cell density, increasing read/write speeds or otherwise reducing operational latency, increasing reliability, increasing data retention, reducing power consumption, or reducing manufacturing costs, among other metrics.

BRIEF SUMMARY

Figure 1:
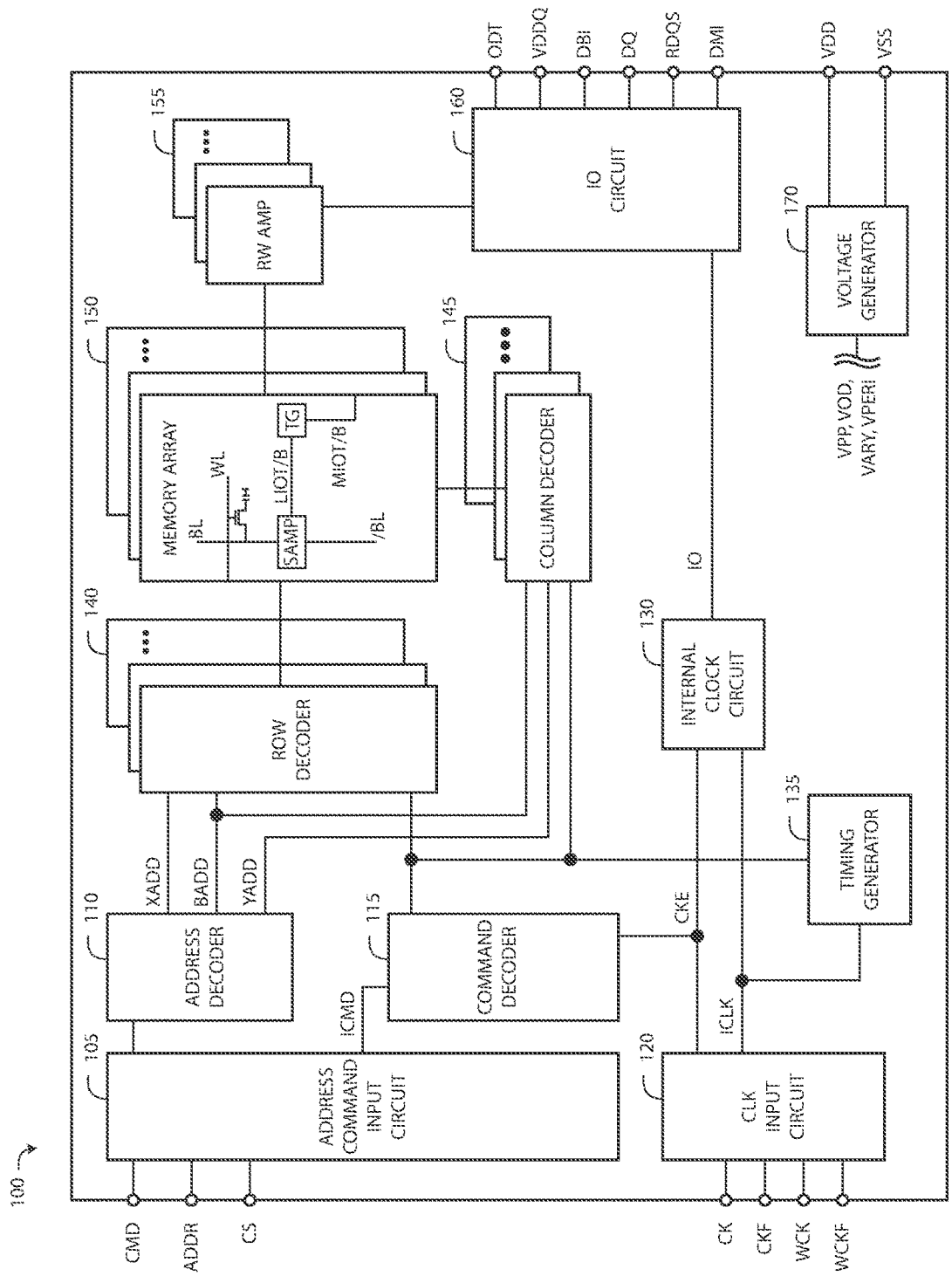
FIG. 1 is a simplified block diagram schematically illustrating a memory device in accordance with an embodiment of the present technology.

Embodiments of the present disclosure relate to memory devices capable of adjusting a clock signal based on an operating speed and a propagation delay of a command/address signal. For example, in one embodiment, an apparatus can include a plurality of memory devices, a clock tree configured to propagate a clock signal to each of the memory devices, and a command/address bus coupled to each of the memory devices and configured to transmit command/address signals to each of the memory devices. A first memory device of the plurality of memory devices can be configured to determine a speed at which the first memory device is operating, to select a clock offset value from plurality of clock offset values based upon the determined speed, and to offset the clock signal received at the memory device from the clock tree by the selected clock offset value. In accordance with one aspect of the disclosure, the apparatus may be configured to store the plurality of clock offset values in a mode register of the first memory device.

DETAILED DESCRIPTION

Semiconductor memories are often provided in memory modules, such as dual in-line memory modules (DIMMs), for use in system applications. These modules can include a plurality of memory devices, each connected to a clock tree for distributing clock signals to the memory devices, and to a command/address bus for distributing command/address signals to the memory devices. Because the topology of the command/address bus and the clock tree can be different (e.g., the command/address bus can employ a single-ended signaling daisy-chain topology while the clock tree can employ a differential signaling daisy-chain topology), they may be implemented with separate traces of the module. In such an arrangement, ensuring that the clock signals and the command/address signals arrive well-aligned at each memory device on the module can present significant challenges. Conventional approaches to tuning the alignment of clock and command/address signals has involved careful trace routing optimization during the design and/or fabrication of the memory module. This approach, although adequate for memory devices operating with lower clock speeds and lower data rates, struggles to provide adequate alignment as clock rates and data rates increase.

A further drawback to the trace routing optimization approach is its inadequacy for optimizing memory modules capable of operating at different clock speeds and data rates. A trace routing optimization that may provide good clock and command/address signal alignment at one operating speed of the memory may not provide sufficient alignment for satisfactory function at a different operating speed of the memory. Therefore, a need exists to provide better clock and command/address signal alignment in memory devices on a memory module capable of operating at different speeds (e.g., different clock speeds and/or data rates).

Accordingly, several embodiments of the present technology are directed to memory devices, systems including memory devices, and methods of operating memory devices in which clock and command/address signal alignment is improved by implementing a clock offset at each memory device corresponding to the speed at which the memory device is operating. Rather than relying solely upon the optimization of trace routing during the module design, embodiments of the present invention can implement different predetermined clock offsets at each memory device of a memory module, with each offset corresponding to the current operating speed of the memory devices and/or memory module, to provide improved clock and command/address signal alignment across a wide variety of operating speeds. In one embodiment, a memory device comprises circuitry configured to determine whether the memory device is operating at a first speed or a second speed different from the first speed; and circuitry configured to, in response to determining that the memory device is operating at the first speed, offset a received clock signal by a first amount corresponding to the first speed, and to, in response to determining that the memory device is operating at the second speed, offset the received clock signal by a second amount corresponding to the second speed.

FIG. 1 is a block diagram schematically illustrating a memory device 100 in accordance with an embodiment of the present technology. The memory device 100 may include an array of memory cells, such as memory array 150. The memory array 150 may include a plurality of banks (e.g., banks 0-15 in the example of FIG. 1), and each bank may include a plurality of word lines (WL), a plurality of bit lines (BL), and a plurality of memory cells arranged at intersections of the word lines and the bit lines. The selection of a word line WL may be performed by a row decoder 140, and the selection of a bit line BL may be performed by a column decoder 145. Sense amplifiers (SAMP) may be provided for corresponding bit lines BL and connected to at least one respective local I/O line pair (LIOT/B), which may in turn be coupled to at least respective one main I/O line pair (MIOT/B), via transfer gates (TG), which can function as switches.

The memory device 100 may employ a plurality of external terminals that include command and address terminals coupled to a command bus and an address bus to receive command signals CMD and address signals ADDR, respectively. The memory device may further include a chip select terminal to receive a chip select signal CS, clock terminals to receive clock signals CK and CKF, data clock terminals to receive data clock signals WCK and WCKF, data terminals DQ, RDQS, DBI, and DMI, power supply terminals VDD, VSS, VDDQ, and VSSQ, and on-die termination terminal(s) ODT.

The command terminals and address terminals may be supplied with an address signal and a bank address signal from outside. The address signal and the bank address signal supplied to the address terminals can be transferred, via a command/address input circuit 105, to an address decoder 110. The address decoder 110 can receive the address signals and supply a decoded row address signal (XADD) to the row decoder 140, and a decoded column address signal (YADD) to the column decoder 145. The address decoder 110 can also receive the bank address signal (BADD) and supply the bank address signal to both the row decoder 140 and the column decoder 145.

The command and address terminals may be supplied with command signals CMD, address signals ADDR, and chip selection signals CS, from a memory controller. The command signals may represent various memory commands from the memory controller (e.g., including access commands, which can include read commands and write commands). The select signal CS may be used to select the memory device 100 to respond to commands and addresses provided to the command and address terminals. When an active CS signal is provided to the memory device 100, the commands and addresses can be decoded and memory operations can be performed. The command signals CMD may be provided as internal command signals ICMD to a command decoder 115 via the command/address input circuit 105. The command decoder 115 may include circuits to decode the internal command signals ICMD to generate various internal signals and commands for performing memory operations, for example, a row command signal to select a word line and a column command signal to select a bit line. The internal command signals can also include output and input activation commands, such as clocked command CMDCK.

When a read command is issued and a row address and a column address are timely supplied with the read command, read data can be read from memory cells in the memory array 150 designated by these row address and column address. The read command may be received by the command decoder 115, which can provide internal commands to input/output circuit 160 so that read data can be output from the data terminals DQ, RDQS, DBI, and DMI via read/write amplifiers 155 and the input/output circuit 160 according to the RDQS clock signals. The read data may be provided at a time defined by read latency information RL that can be programmed in the memory device 100, for example, in a mode register (not shown in FIG. 1). The read latency information RL can be defined in terms of clock cycles of the CK clock signal. For example, the read latency information RL can be a number of clock cycles of the CK signal after the read command is received by the memory device 100 when the associated read data is provided.

When a write command is issued and a row address and a column address are timely supplied with the command, write data can be supplied to the data terminals DQ, DBI, and DMI according to the WCK and WCKF clock signals. The write command may be received by the command decoder 115, which can provide internal commands to the input/output circuit 160 so that the write data can be received by data receivers in the input/output circuit 160, and supplied via the input/output circuit 160 and the read/write amplifiers 155 to the memory array 150. The write data may be written in the memory cell designated by the row address and the column address. The write data may be provided to the data terminals at a time that is defined by write latency information WL. The write latency information WL can be programmed in the memory device 100, for example, in the mode register (not shown in FIG. 1). The write latency information WL can be defined in terms of clock cycles of the CK clock signal. For example, the write latency information WL can be a number of clock cycles of the CK signal after the write command is received by the memory device 100 when the associated write data is received.

The power supply terminals may be supplied with power supply potentials VDD and VSS. These power supply potentials VDD and VSS can be supplied to an internal voltage generator circuit 170. The internal voltage generator circuit 170 can generate various internal potentials VPP, VOD, VARY, VPERI, and the like based on the power supply potentials VDD and VSS. The internal potential VPP can be used in the row decoder 140, the internal potentials VOD and VARY can be used in the sense amplifiers included in the memory array 150, and the internal potential VPERI can be used in many other circuit blocks.

The power supply terminal may also be supplied with power supply potential VDDQ. The power supply potential VDDQ can be supplied to the input/output circuit 160 together with the power supply potential VSS. The power supply potential VDDQ can be the same potential as the power supply potential VDD in an embodiment of the present technology. The power supply potential VDDQ can be a different potential from the power supply potential VDD in another embodiment of the present technology. However, the dedicated power supply potential VDDQ can be used for the input/output circuit 160 so that power supply noise generated by the input/output circuit 160 does not propagate to the other circuit blocks.

The on-die termination terminal(s) may be supplied with an on-die termination signal ODT. The on-die termination signal ODT can be supplied to the input/output circuit 160 to instruct the memory device 100 to enter an on-die termination mode (e.g., to provide one of a predetermined number of impedance levels at one or more of the other terminals of the memory device 100).

The clock terminals and data clock terminals may be supplied with external clock signals and complementary external clock signals. The external clock signals CK, CKF, WCK, WCKF can be supplied to a clock input circuit 120. The CK and CKF signals can be complementary, and the WCK and WCKF signals can also be complementary. Complementary clock signals can have opposite clock levels and transition between the opposite clock levels at the same time. For example, when a clock signal is at a low clock level a complementary clock signal is at a high level, and when the clock signal is at a high clock level the complementary clock signal is at a low clock level. Moreover, when the clock signal transitions from the low clock level to the high clock level the complementary clock signal transitions from the high clock level to the low clock level, and when the clock signal transitions from the high clock level to the low clock level the complementary clock signal transitions from the low clock level to the high clock level.

Input buffers included in the clock input circuit 120 can receive the external clock signals. For example, when enabled by a CKE signal from the command decoder 115, an input buffer can receive the CK and CKF signals and the WCK and WCKF signals. The clock input circuit 120 can receive the external clock signals to generate internal clock signals ICLK. The internal clock signals ICLK can be supplied to an internal clock circuit 130. The internal clock circuit 130 can provide various phase and frequency controlled internal clock signal based on the received internal clock signals ICLK and a clock enable signal CKE from the command/address input circuit 105. For example, the internal clock circuit 130 can include a clock path (not shown in FIG. 1) that receives the internal clock signal ICLK and provides various clock signals to the command decoder 115. The internal clock circuit 130 can further provide input/output (IO) clock signals. The IO clock signals can be supplied to the input/output circuit 160 and can be used as a timing signal for determining an output timing of read data and the input timing of write data. The IO clock signals can be provided at multiple clock frequencies so that data can be output from and input to the memory device 100 at different data rates. A higher clock frequency may be desirable when high memory speed is desired. A lower clock frequency may be desirable when lower power consumption is desired. The internal clock signals ICLK can also be supplied to a timing generator 135 and thus various internal clock signals can be generated.

According to one aspect of the present disclosure, the memory device 100 can be configured to determine a speed at which the memory device 100 is operating (e.g., a clock speed and/or a data rate) and to select and implement, from a plurality of predetermined clock offset values, a clock offset value corresponding to the determined speed to provide improved clock and command/address signal alignment at the memory device 100. For example, clock input circuit 120 can include circuitry to measure a clock speed of a received clock signal, such as complementary clock signals CK and CKF, and/or complementary data clock signals WCK and WCKF. Based on the determined speed, clock input circuit 120 or another logic circuit can select (e.g., from a mode register of memory device 100) a predetermined clock offset value corresponding to the measured speed, and implement the clock offset by, e.g., delaying the received clock signal(s) by the clock offset value relative to the received command/address signals, or advancing the received clock signal(s) by the clock offset value relative to the received command/address signals (e.g., by delaying the command/address signals received at the command/address input circuit 105).

According to one aspect of the present technology, a memory device may also be configured to determine its speed by receiving an indication from, e.g., a memory controller or a connected host device, specifying the speed (e.g., clock speed or data rate) at which the memory device is operating. In another embodiment, a memory device may be configured to determine its speed by measuring an internally-generated clock signal, or in any one of a number of other methods known to those of skill in the art, in keeping with various embodiments of the present technology.

In accordance with one aspect of the present disclosure, the memory device 100 can include a mode register or other data store including a plurality of clock offset values, each corresponding to an operating speed of the memory device. In this way, the memory device can be operated at any one of a variety of speeds by a connected host device, and at each speed, the memory device can select and implement a clock offset value that has been predetermined to provide proper clock and command/address signal alignment. This feature allows the memory device 100 to function especially well in a memory module including a variety of memory devices at different positions along a clock tree and command/address bus, each accordingly having different clock offset values for each intended speed of operation, such as the memory module illustrated schematically in a simplified block diagram in FIG. 2 in accordance with an embodiment of the present technology.

Figure 2:
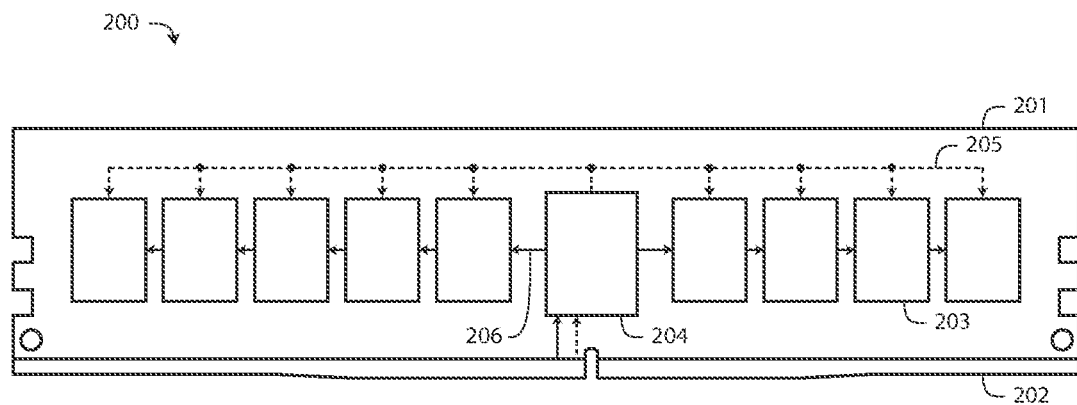
FIG. 2 is a simplified block diagram schematically illustrating a memory module in accordance with an embodiment of the present technology.

As can be seen with reference to FIG. 2, a memory module 200 (e.g., a dual in-line memory module (DIMM)) can include a substrate (e.g., printed circuit board (PCB) or the like) having an edge connector 202 for communicating with a connected host device, a plurality of memory devices 203 (e.g., such as DRAM memory devices). Memory module 200 can also include a registering clock driver (RCD) 204 for receiving clock and command/address signals from the edge connector 202 and for re-driving/distributing the signals to the memory devices 203 over a clock tree 205 and a command/address bus 206. The module can also include data connections (not shown) directly between the memory devices 203 and the edge connector, for exchanging data with the connected host device.

Because each memory device 203 is in a different physical and topological position with respect to the clock tree 205 and the command/address bus 206, the propagation delay of clock and command/address signals received at each memory device 203 from the RCD 204 can vary. In conventional approaches, this challenge would be addressed by optimizing the layout of the traces for the clock tree 205 and the command/address bus 206 (e.g., by selecting the length, resistance, impedance, and other aspects of the traces of the clock tree 205 and the command/address bus 206 to mitigate the different delays in the propagation of signals). This approach, as set forth in greater detail above, may be able to optimize for operation at a single speed (e.g., a single clock speed and/or data rate), but when operated at a different speed than that for which it was optimized, such a memory module can experience signal misalignment at some, if not all, of the memory devices.

Accordingly, embodiments of the present technology can provide a memory module in which the memory devices are each configured to determine a speed at which the memory device is operating, to select a clock offset value from plurality of clock offset values based upon (e.g., corresponding to) the determined speed, and to offset the clock signal relative to the command/address signal by the selected clock offset value. The plurality of clock offset values can be stored in a mode register or other data store of each memory device, as set forth in greater detail above. Because each memory device in a memory module is located in a different position in the topology of the clock tree and command/address bus, the clock offset value for each memory device at each intended speed of operation may be independently determined. Populating the mode register of each memory device can be performed in a tuning operation. To independently determine each clock offset value for each intended speed of operation for each memory device, iterative testing of different clock offset values at each memory device at each speed may be performed after the module is fabricated and the values stored in the mode register (or other data store) of each memory device.

Figure 3:
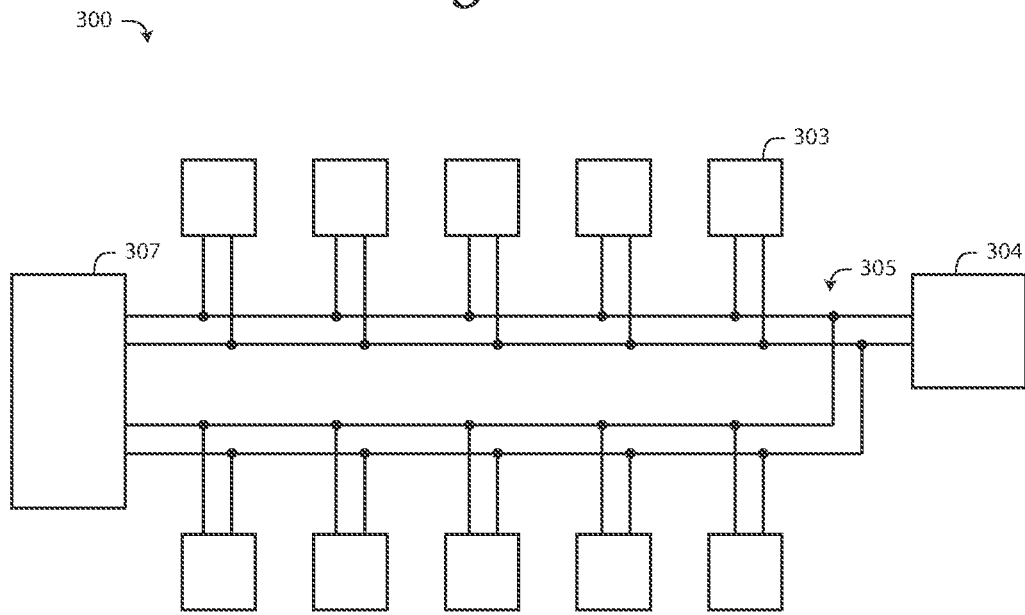
FIG. 3 is a simplified block diagram schematically illustrating a clock tree of a memory module in accordance with an embodiment of the present technology.
Figure 4:
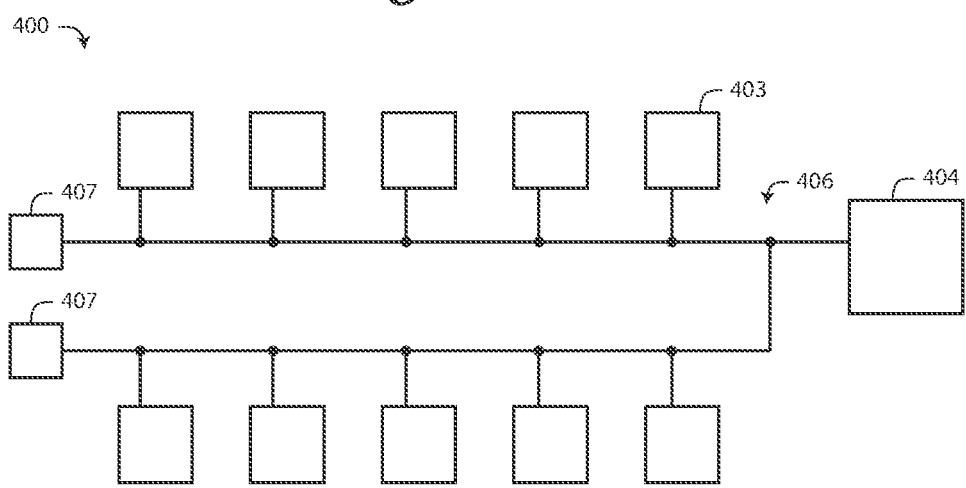
FIG. 4 is a simplified block diagram schematically illustrating a command/address bus of a memory module in accordance with an embodiment of the present technology.

Examples of the different topologies of a clock tree and a command/address bus of a memory module are provided schematically in the simplified block diagrams of FIGS. 3 and 4 in accordance with various embodiments of the present technology. As can be seen with reference to FIG. 3, a clock tree 300 of a memory module can include differential traces 305 providing differential clock signals from an RCD 304 to each of a plurality of memory devices 303 in parallel. The signals may be terminated at a termination block 307 with high resistance and low capacitance (e.g., 36Ω and 0.01 μF, respectively). In FIG. 4, by way of contrast, a command/address bus 400 of a memory module can include traces 406 providing command/address signals from an RCD 404 to each of a plurality of memory devices 403 in several parallel circuits. Each parallel circuit may be separately terminated by connection to a termination voltage (VTT) 407 through, e.g., a 20Ω resistor. The different trace lengths, electrical properties, topologies (e.g., differential single-ended), etc. all contribute to the different propagation speed of clock and command/address signals through the clock tree and the command/address bus.

Figure 5:
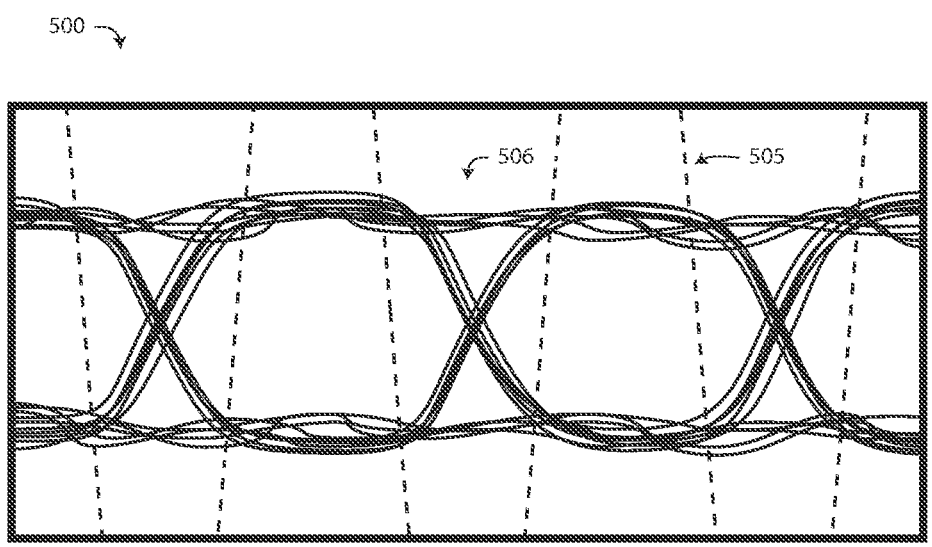
FIG. 5 is a simplified schematic data eye diagram schematically illustrating the misalignment of a clock signal and command/address signals received at a memory device prior to implementing a clock offset in accordance with an embodiment of the present technology.

When the clock and command/address signals are not well aligned at a memory device, performance may suffer due to, e.g., incorrectly decoded commands and addresses. FIG. 5 is a simplified schematic data eye diagram schematically illustrating the misalignment of a clock signal and command/address signals received at a memory device prior to implementing a clock offset in accordance with an embodiment of the present technology. As can be seen with reference to the data eye diagram 500 of FIG. 5, each rising edge of the clock signal 505 is provided well in advance of the middle of each data eye of the command/address signals 506. Because the command/address signals are generally sampled concurrently with the rising edge of the clock signal 505, this poor alignment can cause some of the command/address signals 506 to be sampled before they have settled to their intended high or low value (e.g., while still rising or falling). Accordingly, implementing a clock offset value, as set forth in greater detail above, can address the misalignment of signals received at the memory device by delaying the clock signal by the clock offset value, or alternatively by advancing the clock signal by the same amount (e.g., by delaying the command/address signals relative to the clock signal).

Figure 6:
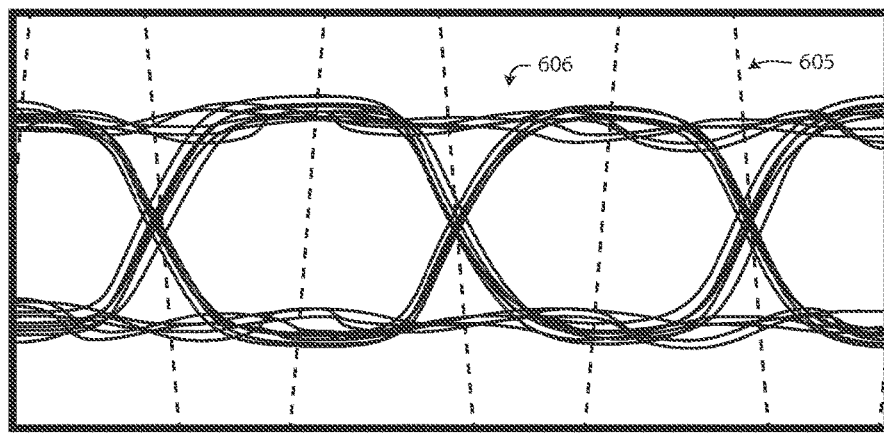
FIG. 6 is a simplified schematic data eye diagram schematically illustrating the alignment of a clock signal and command/address signals within a memory device in accordance with an embodiment of the present technology.

FIG. 6 is a simplified schematic data eye diagram schematically illustrating the alignment of a clock signal and command/address signals within a memory device in accordance with an embodiment of the present technology. As can be seen with reference to the data eye diagram 600 of FIG. 6, following the implementation of the clock offset value within the memory device, each rising edge of the clock signal 605 is provided well-aligned with the middle of each data eye of the command/address signals 606. Accordingly, command/address signals sampled concurrently with the rising edge of the clock signal 605 are more likely to have settled to their intended high or low value, and less likely to be incorrectly decoded.

Figure 7:
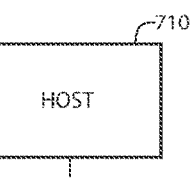
FIG. 7 is a simplified block diagram schematically illustrating a memory system in accordance with an embodiment of the present technology.
Figure 7:
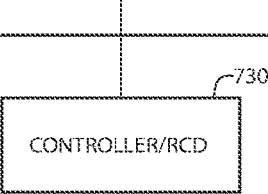
Figure 7:
Figure 7:
Figure 7:
Figure 7:
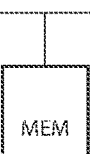
Figure 7:
Figure 7:
Figure 7:
Figure 7:
Figure 7:

FIG. 7 is a simplified block diagram schematically illustrating a memory system 700 in accordance with an embodiment of the present technology. Memory system 700 includes a host device 710 operably coupled to a memory module 720 (e.g., a dual in-line memory module (DIMM)). Memory module 720 can include a controller or a RCD 730 operably connected by one or more buses (such as bus 740) to a plurality of memory devices 750. In accordance with one aspect of the present disclosure, the memory devices 750 can each detect (e.g., by measuring or receiving an indication of) a speed at which the memory system 700 and/or each memory device 750 is operating and implement a clock offset to provide improved alignment between a clock signal and command/address signals received from the controller or RCD 730, as set forth above in greater detail.

Although in the foregoing example embodiments, memory modules and devices have been illustrated and described with respect to DRAM devices, embodiments of the present technology may have application to other memory technologies, including SRAM, SDRAM, NAND and/or NOR flash, phase change memory (PCM), magnetic RAM (MRAM), ferroelectric RAM (FeRAM), etc. Moreover, although memory modules have been illustrated and described as dual in-line memory modules (DIMMs) having a particular number of memory devices, embodiments of the disclosure may include more or fewer memory devices, and/or involve other memory module or package formats (e.g., single in-line memory modules (SIMMs), small outline DIMMS (SODIMMs), single in-line pin packages (SIPPs), custom memory packages, etc.). Moreover, although DIMMs have been described and illustrated with dedicated RCD dies, in other embodiments RCD dies (and/or other integrated circuit dies, such as memory controllers, processors, etc.) may or may not be included in the memory modules (e.g., memory modules in which the clock trees and command/address buses connect directly from a memory module connector to the memory devices).

Figure 8:
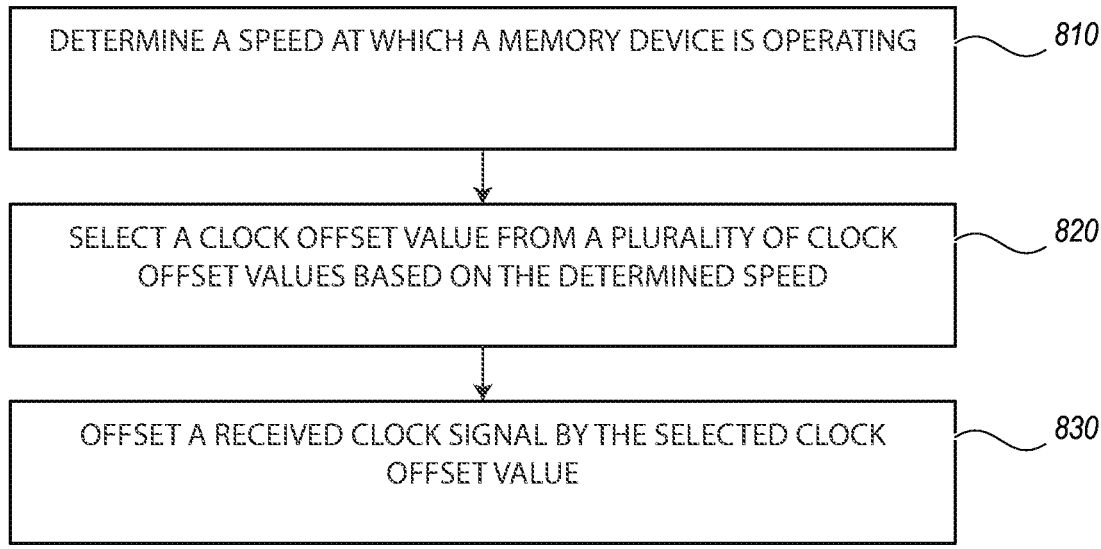
FIG. 8 is a flow chart illustrating a method of operating a memory system in accordance with an embodiment of the present technology.

FIG. 8 is a flow chart illustrating a method of operating a memory device. The method includes determining a speed at which the memory device is operating (box 810). According to one aspect of the present disclosure, the determining features of box 810 may be implemented with clock input circuit 120 or command/address input circuit 105, as illustrated in FIG. 1 in greater detail, above. The method further includes selecting a clock offset value from a plurality of clock offset values based on the determined speed (box 820). According to one aspect of the present disclosure, the selecting features of box 820 may be implemented with clock input circuit 120, as illustrated in FIG. 1 in greater detail, above. The method further includes offsetting a received clock signal by the selected clock offset value (box 830). According to one aspect of the present disclosure, the offsetting features of box 830 may be implemented with clock input circuit 120 or command/address input circuit 105, as illustrated in FIG. 1 in greater detail, above. The method may further include sampling the command/address signal concurrently with the rising edge of the offset clock signal (not illustrated). According to one aspect of the present disclosure, the foregoing sampling features may be implemented with clock input circuit 120, command/address input circuit 105, address decoder 110 and/or command decoder 115, as illustrated in FIG. 1 in greater detail, above.

Figure 9:
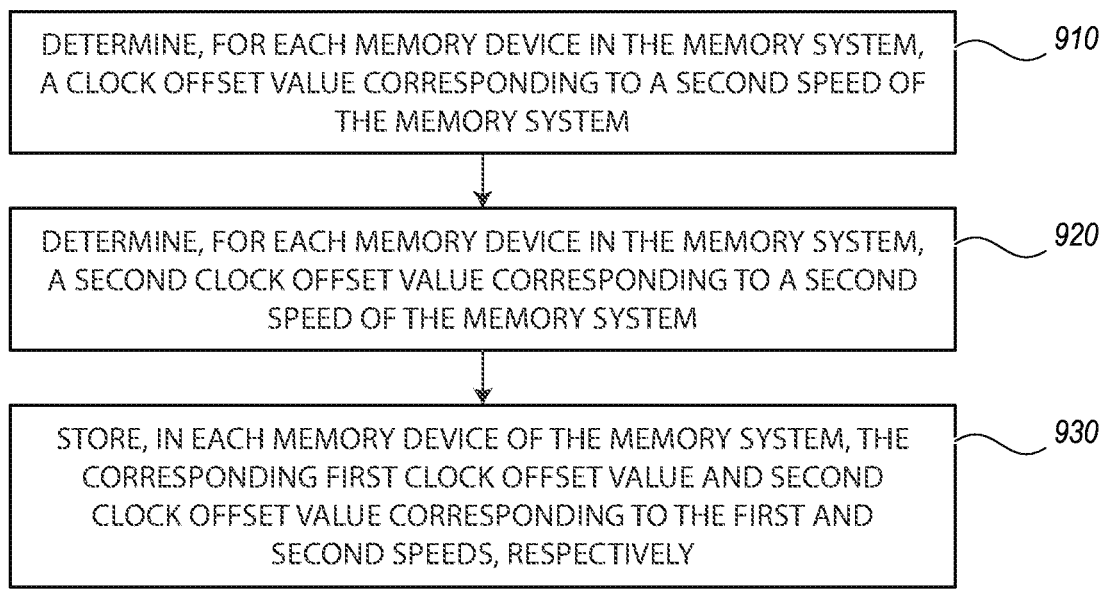
FIG. 9 is a flow chart illustrating a method of operating a memory device in accordance with an embodiment of the present technology.

FIG. 9 is a flow chart illustrating a method of configuring a memory system. The method includes determining, for each memory device in the memory system, a clock offset value corresponding to a second speed of the memory system (box 910). According to one aspect of the present disclosure, the determining features of box 910 may be implemented with RCD 204, controller/RCD 730, or host device 710 as illustrated in FIGS. 2 and 7 in greater detail, above. The method further includes determining, for each memory device in the memory system, a second clock offset value corresponding to a second speed of the memory system (box 920). According to one aspect of the present disclosure, the determining features of box 920 may be implemented with RCD 204, controller/RCD 730, or host device 710 as illustrated in FIGS. 2 and 7 in greater detail, above. The method further includes storing, in each memory device of the memory system, the corresponding first clock offset value and second clock offset value corresponding to the first and second speeds, respectively (box 930). According to one aspect of the present disclosure, the storing features of box 930 may be implemented with command/address input circuit 105, clock input circuit 120, or a mode register (not illustrated) of memory device 100, as illustrated in FIG. 1 in greater detail, above.

It should be noted that the methods described above describe possible implementations, and that the operations and the steps may be rearranged or otherwise modified and that other implementations are possible. Furthermore, embodiments from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The devices discussed herein, including a memory device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The functions described herein may be implemented in hardware, software executed by a processor, firmware, or any combination thereof. Other examples and implementations are within the scope of the disclosure and appended claims. Features implementing functions may also be physically located at various positions, including being distributed such that portions of functions are implemented at different physical locations.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

What is claimed is:

1. An apparatus comprising:
   a first memory device and a second memory device;
   a clock tree configured to propagate a clock signal to the first and second memory devices; and
   a command/address bus coupled to the first and second memory devices and configured to transmit command/address signals to the first and second memory devices;
   circuitry configured to determine positions of the first and second memory devices in a topology of the command/address bus and/or a topology of the clock tree;
   wherein the first memory device is configured to offset the clock signal received at the first memory device from the clock tree by a clock offset value based on the determined position of the first memory device in the topology of the command/address bus and/or the topology of the clock tree, and
   wherein the clock offset value is based at least in part on a speed at which the first memory device is operating, the second memory devices is operating, or both.

2. The apparatus of claim 1, wherein the clock offset value is non-zero.

3. The apparatus of claim 1, wherein the clock tree and the command/address bus have different topologies.

4. The apparatus of claim 3, wherein the first memory device and the second memory device have different positions in the topologies of the clock tree and the command/address bus.

5. The apparatus of claim 4, wherein the first memory device is configured to select the clock offset value from a plurality of clock offset values corresponding to indications stored at the first memory device, and wherein each of the plurality of clock offset values corresponds to one of the different positions.

6. The apparatus of claim 1, wherein the first memory device is configured to determine the speed at which the first memory device is operating based upon a clock speed of the clock signal.

7. The apparatus of claim 1, wherein the first memory device is configured to determine the speed at which the first memory device is operating based upon receiving an indication of the speed from a connected host device.

8. The apparatus of claim 1, further comprising a registering clock driver (RCD) configured to provide the clock signal to the clock tree and to provide the command/address signals to the command/address bus.

9. An apparatus comprising:
   a first memory device and a second memory device;
   a clock tree configured to propagate a clock signal to the first and second memory devices;
   a command/address bus coupled to the first and second memory devices and configured to transmit command/address signals to the first and second memory devices; and
   circuitry configured to determine positions of the first and second memory devices in a topology of the command/address bus and/or a topology of the clock tree;
   wherein the first memory device and the second memory device have different positions in the topology of the clock tree and/or the topology of the command/address bus, and
   wherein the first memory device is configured to offset the clock signal received at the first memory device from the clock tree by a clock offset value based on the determined position of the first memory device in the topology of the command/address bus and/or the topology of the clock tree.

10. The apparatus of claim 9, wherein the clock offset value is further based at least in part on a speed at which the first memory device is operating.

11. The apparatus of claim 9, wherein the clock offset value is non-zero.

12. The apparatus of claim 9, wherein the clock tree and the command/address bus have different topologies.

13. The apparatus of claim 9, further comprising a registering clock driver (RCD) configured to provide the clock signal to the clock tree and to provide the command/address signals to the command/address bus.

14. A method comprising:
    determining one or more speeds at which a first memory device is operating, a second memory device is operating, or both;
    determining the positions of the first and second memory devices in the command/address bus topology and/or the clock tree topology;
    selecting, from a plurality of clock offset values, a clock offset value for the first memory device based on the determined one or more speeds; and
    offsetting a clock signal received at the first memory device by first clock offset value;
    wherein each of the plurality of clock offset values correspond to one of the determined positions of the corresponding first and second memory device in the command/address bus topology and/or the clock tree topology.

15. The method of claim 14, further comprising:
    storing indications corresponding to the plurality of clock offset values in a mode register of the first memory device.

16. The method of claim 14, further comprising:
    performing a tuning operation on the first memory device to determine the plurality of clock offset values.

17. The method of claim 14, further comprising:
    measuring a clock speed of the received clock signal, wherein the speed at which the first and second memory devices are operating is determined based at least in part on the measured clock speed.

18. The method of claim 14, further comprising:
    receiving an indication of the speed from a host device, wherein the speed at which the memory device is operating is determined based at least in part on the received indication.

19. The method of claim 14, wherein the clock offset value is non-zero.

20. The method of claim 14, wherein the clock tree and the command/address bus have different topologies.

* * * * *